United States Patent
Tullberg et al.

(10) Patent No.: US 11,870,458 B2
(45) Date of Patent: Jan. 9, 2024

(54) NETWORK NODE AND METHOD PERFORMED THEREIN FOR HANDLING COMMUNICATION

(71) Applicant: Telefonaktiebolaget LM Ericsson (publ), Stockholm (SE)

(72) Inventors: Hugo Tullberg, Nyköping (SE); Guido Carlo Ferrante, Stockholm (SE)

(73) Assignee: TELEFONAKTIEBOLAGET LM ERICSSON (PUBL), Stockholm (SE)

(*) Notice: Subject to any disclaimer, the term of this patent is extended or adjusted under 35 U.S.C. 154(b) by 0 days.

(21) Appl. No.: 17/915,008

(22) PCT Filed: Apr. 7, 2020

(86) PCT No.: PCT/SE2020/050359
§ 371 (c)(1),
(2) Date: Sep. 27, 2022

(87) PCT Pub. No.: WO2021/206593
PCT Pub. Date: Oct. 14, 2021

(65) Prior Publication Data
US 2023/0155607 A1    May 18, 2023

(51) Int. Cl.
*H03M 13/11* (2006.01)
*H03M 13/00* (2006.01)
*H04L 1/00* (2006.01)

(52) U.S. Cl.
CPC ... *H03M 13/1102* (2013.01); *H03M 13/6597* (2013.01); *H04L 1/0045* (2013.01)

(58) Field of Classification Search
CPC ......... H03M 13/1102; H03M 13/6597; H03M 23/6561; H03M 13/6569; H03M 13/114;
(Continued)

(56) References Cited

U.S. PATENT DOCUMENTS

| 11,664,823 B2 * | 5/2023 | Wu ..................... H03M 13/1128 |
| | | 714/776 |
| 2008/0052558 A1 * | 2/2008 | Sun ..................... H03M 13/6583 |
| | | 714/11 |

(Continued)

FOREIGN PATENT DOCUMENTS

| CA | 2857921 A1 | 2/2015 |
| CN | 106911336 A | 6/2017 |

OTHER PUBLICATIONS

International Search Report and Written Opinion dated Feb. 24, 2021 for International Application No. PCT/SE2020/050359 filed Apr. 7, 2020; consisting of 10 pages.

(Continued)

*Primary Examiner* — Albert Decady
*Assistant Examiner* — Enam Ahmed
(74) *Attorney, Agent, or Firm* — Christopher & Weisberg, P.A.

(57) ABSTRACT

Embodiments herein relate to a method performed by a network node for handling a received signal in a communication network. The network node distributes a first number of inputs of a demodulated signal to a first processing core of at least two processing cores and a second number of inputs of the demodulated signal to a second processing core of the at least two processing cores. The network node further decodes the first number of inputs of the demodulated signal by a first message passing within the first processing core, and decodes the second number of inputs of the demodulated signal by a second message passing within the second processing core. The network node further decodes the demodulated signal by performing a third message passing between the different processing cores over a bus that is performed according to a set schedule.

18 Claims, 8 Drawing Sheets

(58) Field of Classification Search
CPC .. H03M 13/1111; H03M 13/13; H04L 1/0045
USPC .......................................................... 714/776
See application file for complete search history.

(56) References Cited

U.S. PATENT DOCUMENTS

| | | | |
|---|---|---|---|
| 2008/0072122 | A1 | 3/2008 | Nimbalker et al. |
| 2008/0215950 | A1 | 9/2008 | Shen et al. |
| 2010/0088575 | A1 | 4/2010 | Sharon et al. |
| 2017/0201344 | A1 | 7/2017 | Lim et al. |
| 2020/0058263 | A1* | 2/2020 | McKeever ............. G09G 5/001 |

OTHER PUBLICATIONS

Debbabi, Imen, et al.; Multicore Implementation of LDPC Decoders Based on ADMM Algorithm; 2016 IEEE International Conference on Acoustics, Speech and Signal Processing (ICASSP); Shanghai, China, 2016; consisting of 5 pages.

Wu, Michael, et al.; HSPA+/LTE-A Turbo Decoder on GPU and Multicore CPU; 2013 Asilomar Conference on Signals, Systems and Computers, Pacific Grove, CA, USA, 2013; consisting of 5 pages.

Yu, Zhiyi, et al.; A 16-Core Processor with Shared-Memory and Message-Passing Communications; IEEE Transactions on Circuits and Systems I: Regular Papers, vol. 61, No. 4, Apr. 2014; consisting of 14 pages.

Wu, Chi-Jen, et al.; A New Construction of Irregular LDPC Convolutional Codes with Cycle Removal; 2010 International Symposium on Information Theory & Its Applications; Taichung, Taiwan, China, Oct. 17-20, 2010; consisting of 6 pages.

European Search Report dated Aug. 28, 2023 for Application No. 20930376.7, consisting of 9 pages.

Pravin Kumar, et al. "An Efficient Methodolgy for Parallel Concatenation of LDPC Codes with Reduced Complexity and Decoding Delay," IEEE; Department of Electronics and Electrical Engineering; Indian Institute of Technology Guwahati; 2013, consisting of 5 pages.

Kschischang et al. "Factor Graphs and the Sum-Product Algorithm," IEEE Transactions on Information Theory, vol. 47, No. 2, pp. 498-519; Feb. 2001, consisting of 22 pages.

* cited by examiner

NETWORK NODE AND METHOD PERFORMED THEREIN FOR HANDLING COMMUNICATION

CROSS-REFERENCE TO RELATED APPLICATIONS

This application is a Submission Under 35 U.S.C. § 371 for U.S. National Stage Patent Application of International Application Number: PCT/SE2020/050359, filed Apr. 7, 2020 entitled "NETWORK NODE AND METHOD FOR IMPROVED DECODING IN A NETWORK NODE," the entirety of which is incorporated herein by reference.

TECHNICAL FIELD

Embodiments herein relate to a network node and a method performed therein regarding wireless communication. Furthermore, a computer program product and a computer readable storage medium are also provided herein. In particular, embodiments herein relate to handling communication e.g. decoding data transmissions, in a wireless communication network.

BACKGROUND

In a typical wireless communication network, user equipments (UE), also known as wireless communication devices, mobile stations, wireless devices, stations (STA) and/or, may communicate via a Radio Access Network (RAN) to one or more core networks (CN). The RAN covers a geographical area which is divided into service areas, also known as cells, with each cell being served by a radio network node also referred to as access node e.g., a Wi-Fi access point or a radio base station (RBS), which in some networks may also be called, for example, a NodeB, an eNodeB or a gNodeB. The cell is a geographical area where radio coverage is provided by the radio network node. The radio network node operates on radio frequencies to communicate over an air interface with the UEs within range of the radio network node. The radio network node communicates over a downlink (DL) to the UE and the UE communicates over an uplink (UL) to the radio network node.

A Universal Mobile Telecommunications network (UMTS) is a third generation (3G) telecommunications network, which evolved from the second generation (2G) Global System for Mobile Communications (GSM). The UMTS terrestrial radio access network (UTRAN) is essentially a RAN using wideband code division multiple access (WCDMA) and/or High Speed Packet Access (HSPA) for user equipments. In a forum known as the Third Generation Partnership Project (3GPP), telecommunications suppliers propose and agree upon standards for e.g. third generation networks, and investigate enhanced data rate and radio capacity and upcoming generation networks. In some RANs, e.g. as in UMTS, several radio network nodes may be connected, e.g., by landlines or microwave, to a controller node, such as a radio network controller (RNC) or a base station controller (BSC), which supervises and coordinates various activities of the plural radio network nodes connected thereto. This type of connection is sometimes referred to as a backhaul connection. The RNCs and BSCs are typically connected to one or more core networks. Specifications for the Evolved Packet System (EPS), also called a Fourth Generation (4G) network, have been completed within the 3GPP and this work continues in the coming 3GPP releases, for example to specify a Fifth Generation (5G) network. The EPS comprises the Evolved Universal Terrestrial Radio Access Network (E-UTRAN), also known as the Long Term Evolution (LTE) radio access network, and the Evolved Packet Core (EPC), also known as System Architecture Evolution (SAE) core network. E-UTRAN/LTE is a variant of a 3GPP radio access network wherein the radio network nodes are directly connected to the EPC core network rather than to RNCs. In general, in E-UTRAN/LTE the functions of an RNC are distributed between the radio network nodes, e.g. eNodeBs in LTE, and the core network. As such, the RAN of an EPS has an essentially "flat" architecture comprising radio network nodes connected directly to one or more core networks, i.e. they are not connected to RNCs. To compensate for that, the E-UTRAN specification defines a direct interface between the radio network nodes, this interface being denoted the X2 interface.

With the emerging 5G technologies such as New Radio (NR), the use of very many transmit- and receive-antenna elements is of great interest as it makes it possible to utilize beamforming, such as transmit-side and receive-side beamforming. Transmit-side beamforming means that the transmitter can amplify the transmitted signals in a selected direction or directions, while suppressing the transmitted signals in other directions. Similarly, on the receive-side, a receiver can amplify signals from a selected direction or directions, while suppressing unwanted signals from other directions.

In telecommunication and coding theory, an error correcting code (ECC) may be used for controlling errors in data over unreliable or noisy communication channels. Forward error correction (FEC) is a technique used wherein the central idea is that the sender encodes the message in a redundant way, by using an ECC. The redundancy allows the receiver to detect a limited number of errors that may occur anywhere in the message, and often to correct these errors without re-transmission. FEC gives the receiver the ability to correct errors without needing a reverse channel to request re-transmission of data, but at the cost of a fixed, higher forward channel bandwidth. In the past decades, several near-capacity forward error correcting (FEC) codes have emerged, including Turbo codes, Low-density parity-check (LDPC) codes and Polar codes. In 3GPP, Turbo codes are used in 3G UMTS and 4G LTE, and LDPC codes are used for the user plane in 5G NR and Polar codes for the control plane in 5G NR. In other standards, LDPC codes are used in e.g., Wi-Fi, WiGiG, WiMax and DVB.

For all three code classes, the decoding is much more complex than the encoding, since it uses iterative or parallel processes with "soft bits", i.e. probabilistic representations of the encoded bits. Turbo codes and LDPC codes use iterative decoding, where each successive attempt at decoding the information block informs the next one, until the process converges to a legitimate code-word. Polar codes, on the other hand, select the recovered information block from a list of candidates obtained from a parallel successive cancellation decoding process.

Herein binary LDPC codes are exemplified, but the ideas are applicable to non-binary LDPC codes and may be applied to other code classes as well.

LDPC Code Representation.

LDPC codes are defined by a sparse parity-check matrix, H, used in the decoding process. In the encoding, a corresponding generator matrix G is used. While H can be randomly generated, it is often desirable to impose some structure to simplify G and the encoding.

A bipartite graph is often used to represent and visualize an (n, k)-LDPC code, wherein n is the number of bits in a codeword and k is the number of information bits. A bipartite graph consists of two sets of nodes: a set of variable nodes, one for each column of H, and a set of check nodes, one for each row of H. A given variable node is connected to a given check node if and only if the corresponding entry of H is equal to 1. These graphs are sometimes referred to as Tanner graphs or factor graphs.

FIG. 1 shows an example of an H matrix, and the corresponding graph fragment, using Forney's factor graph notation. In this graph, n variable nodes, circles in the graph, are connected to (n-k) constraint or check nodes, squares in the graph. Note that this is not a real LDPC code, the H-matrix is small and the density, fraction of 1's with respect to the total number of elements, is high. However, the graph representation can be applied to LDPC codes as well, the only difference being the size and the number of edges.

In this graph, n variable nodes on the left side of the graph (n=7) are connected to m check nodes on the right side of the graph (m=3). The number of bits encoded is k=n-m (in this case, k=4). Each check node sums (modulo 2) the bits of the variable nodes that are connected to it. The bits of a valid message, when placed at the variable nodes, satisfy the graphical constraints, that is, each check node outputs 0 after the sum modulo 2 of the values of the connected variable nodes (known as "neighbors"). The bits of a generic word, namely a generic sequence of 0s and 1s, do not, in general, satisfy the constraints.

For a regular LDPC code, variable degree, i.e., the number of ones in a row is the same for all rows, and check degree, i.e., the number of ones in a column is the same for all columns. For an irregular LDPC code, the variable degrees are not the same, and/or the check degrees are not the same.

LDPC Decoding and Parallelism.

The iterative decoding of an LDPC code involves passing messages between the nodes along the edges of the code graph. Any algorithm in this class of decoding algorithms is called a message passing (MP) algorithm. Each of the nodes in the graph works in isolation with information available along the connected edges only. These decoding algorithms require passing of the messages back and forth between the nodes for a fixed number of times (known as "iterations") or till the result is achieved, hence the notion "iterative decoding" algorithms.

The fact that the nodes work independently allows different types of parallelism to be used to speed up the decoding. The updates of the messages at nodes of a given type (variable node or check node) can either be computed serially or in a partially parallel or fully parallel fashion. In addition, instead of iterating back and forth between variable nodes and check nodes, the decoder can be "unrolled", i.e., multiple copies of the variable nodes and check nodes can be implemented, and messages passed forward in a pipeline. In both node parallelization and iteration unrolling, multiple compute elements are created, and messages are passed between them. Depending on the message resolution, i.e., the number of bits used to represent the soft values, the amount of data to pass between nodes can be substantial.

Cpu/Tpu Architectures.

Graphics Processor Units (GPU) were originally designed to reduce the execution time of heavy graphics applications, e.g. video rendering and games. Today, General Purpose GPUs (GPGPU) are the choice of hardware to accelerate computational workloads in e.g. Machine Learning (ML), Deep Learning (DL), and Artificial Intelligence (AI). Common to all these applications is that the computations can be broken down into many parallel, comparably simple operations see [1].

Inspired by the application of GPUs for ML and AI, a new kind of compute units are being developed, specifically for ML and AI. These processing units are sometimes referred to as neuromorphic computing units, since they mimic the brain, or Tensor Processing Units (TPUs), since they are optimized for tensor processing in ML. Examples of TPUs include Loihi [2], TrueNorth [3], SpiNNaker [4], Google's TPU [5].

Common to GPU architectures and TPU architectures, see FIG. 2, is that a large number of compute cores is connected by some bus system. The computation takes place in the cores, and data transfer between cores and to other circuitry takes place over the bus system.

Since LDPC decoding can be parallelized, it is natural to consider implementation of LDPC decoders on GPUs and TPUs. LDPC decoding can be implemented on application-specific integrated circuits (ASICs) as well, and designs for unrolled, parallel implementations of LDPC decoders are available today for such architectures. The data transport is an issue there as well, and ASIC implementation can benefit from embodiments herein.

GPU and TPU Bottlenecks.

Whereas the computations in the cores are fast, the communication over the bus system and/or to memory is a performance bottleneck see e.g. [3]. GPU performance is investigated in [6] and it is concluded that graph applications, of which LDPC decoding is one that is not explicitly mentioned in [6], tend to execute kernel and data transfer functions more frequently than non-graph applications. The frequent kernel invocations lead to ineffective use of caches as well. Therefore, the performance overhead due to transfer of the bus as well as long latency memory operations is higher in the graph applications than in the non-graph applications.

Usually, when designing LDPC codes we strive for the best communication performance, i.e., the lowers bit or codeword error rate, for a given code rate, codeword length and max number of decoding iterations. LDPC codes are either regular or irregular. Regular LDPC codes are codes where all variable nodes have the same degree=number of connections, and all check nodes have the same degree (though the degree of the variable nodes are less than the degree of the check nodes). Irregular codes are codes where the different variable nodes have different degrees and similarly for check nodes. The best performing LDPC codes are irregular.

For practical purposes, a structure is often imposed on the codes to simplify the encoding. Cyclic or quasi-cyclic codes are used. The 5G NR codes are quasi-cyclic.

In the decoding the computations are performed in the nodes of the graph, and the edges are paths that in messages (intermediate beliefs of bit values) are passed. The node computation will take place in the cores of GPUs/TPUs.

An LDPC code not designed for GPU/TPU decoding may have very large check node degrees that may not be fitted onto a single core (depending on the size of the cores). What is more likely is that when the LDPC nodes are mapped to different cores, it results in many edges connecting different cores. Hence, LDPC codes that are not designed for decoding on GPUs and TPUs can have block lengths and H-matrices, and corresponding decoding graphs, that span over multiple compute cores and make extensive use of the interconnecting bus system. Thus, if a non-GPU-optimized LDPC code, such as the 3GPP 5G NR LDPC code, is decoded on GPUs/TPUs, the actual performance is not as good as can be expected. In particular, the data transfer on the bus can slow down decoding considerably.

SUMMARY

An object herein is to provide a mechanism to improve performance for decoding data in an efficient manner in a communication network.

According to an aspect the object is achieved, according to embodiments herein, by providing a method performed by a network node for handling a received signal in a communication network. The network node distributes a first number of inputs e.g. bits of a demodulated signal to a first processing core of at least two processing cores and a second number of inputs of the demodulated signal to a second processing core of the at least two processing cores. The network node decodes the first number of inputs of the demodulated signal by a first message passing, e.g. a first number of iterations, within the first processing core, and decodes the second number of inputs of the demodulated signal by a second message passing, e.g. second number of iterations, within the second processing core. The network node further decodes the demodulated signal by performing a third message passing between the different processing cores over a bus that is performed according to a set, such as a pre-set, schedule. Thus, embodiments herein is for handling decoding of data in the communication network. The network node comprises at least two processing cores and a bus system connecting the at least two processing cores. E.g. the network node may comprise one or more GPUs and/or TPUs each comprising a number of processing cores (fast computation units) connected by buses for moving data from input, to cores, between cores and to output. The processing cores and buses may be implemented on the same integrated circuit chip so it is small in physical dimension. The decoding comprises message handling between the at least two processing cores according to the set schedule, e.g. every $5^{th}$ of $10^{th}$ internal iteration of a local processing core. Thus, the numbers of full iterations performed over both the processing cores are limited according to e.g. a limiting schedule.

It is furthermore provided herein a computer program product comprising instructions, which, when executed on at least one processor, cause the at least one processor to carry out any of the methods above, as performed by the network node. It is additionally provided herein a computer-readable storage medium, having stored thereon a computer program product comprising instructions which, when executed on at least one processor, cause the at least one processor to carry out the method according to any of the methods above, as performed by the network node.

According to embodiments herein network node is also herein provided for handling a received signal in a communication network. The network node is configured to distribute a first number of inputs of a demodulated signal to a first processing core of at least two processing cores and a second number of inputs of the demodulated signal to a second processing core of the at least two processing cores. The network node is further configured to decode the first number of inputs of the demodulated signal by a first message passing within the first processing core, and decode the second number of inputs of the demodulated signal by a second message passing within the second processing core, and to further decode the demodulated signal by performing a third message passing between the different processing cores over a bus that is performed according to a set schedule.

A decoding process is herein provided that modifies the classic message passing procedure to take into account the presence of multiple processing cores and bus system between the processing cores. Messages between the processing cores are updated according to the set schedule e.g. only at specific times or iterations, e.g. a set interval, and not every iteration as in classic message passing procedures. The goal of embodiments herein is to use the bus between the processing cores the minimum number of times while performing as much computation as possible within the processing cores.

Thus, embodiments herein achieve an improved performance for decoding data in an efficient manner in the communication network

BRIEF DESCRIPTION OF THE DRAWINGS

Embodiments will now be described in more detail in relation to the enclosed drawings, in which.

DETAILED DESCRIPTION

Figure 1:
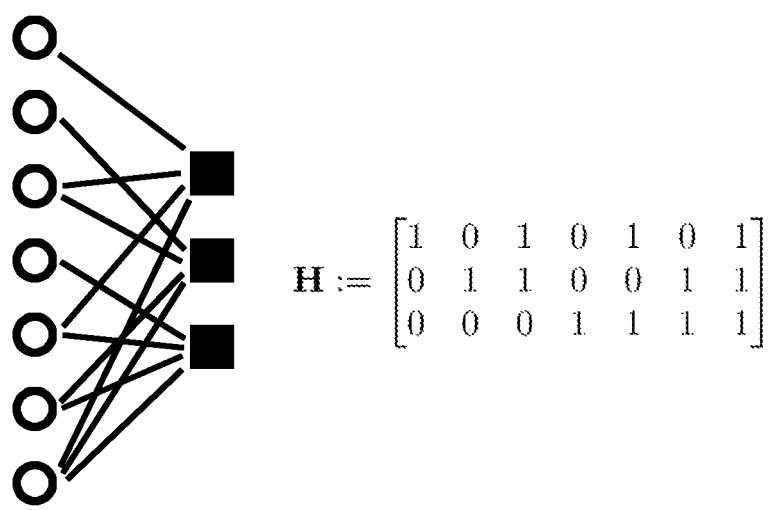
FIG. 1 shows a visual representations of variables and functions of a codeword.
Figure 2:
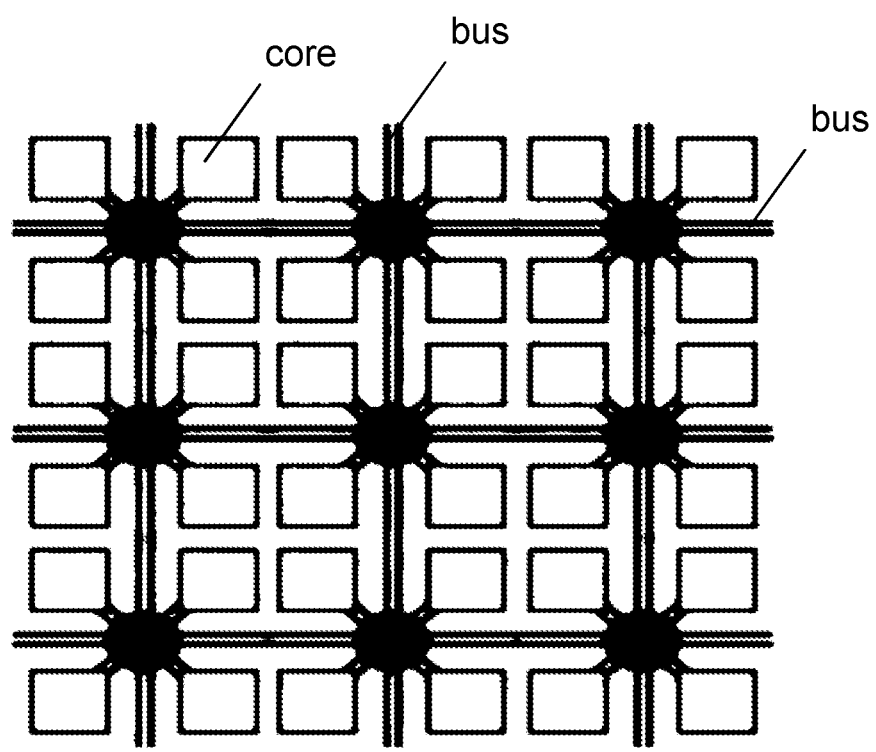
FIG. 2 shows an arrangement comprising a number of processing cores and connected via a bus arrangement.
Figure 3:
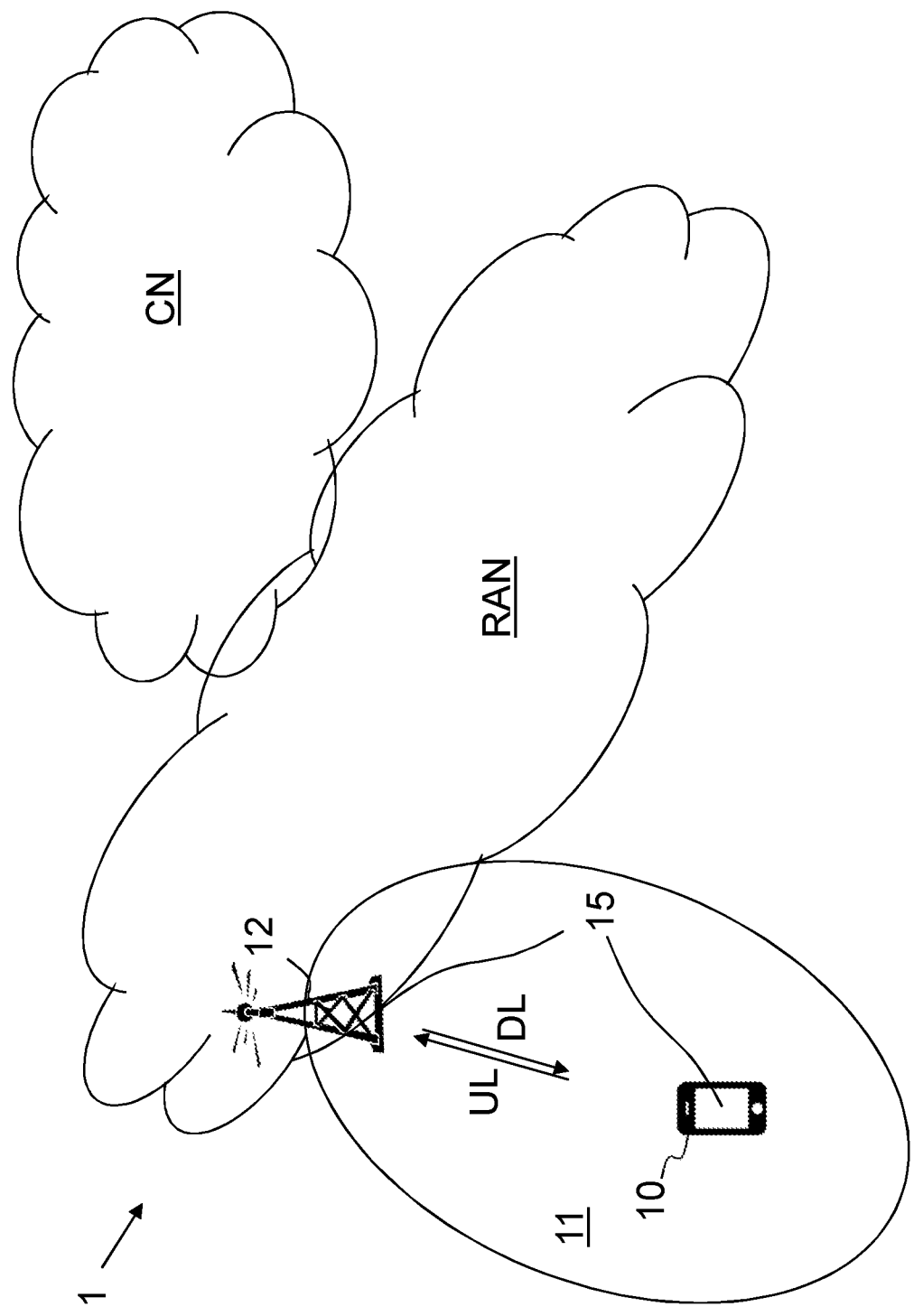
FIG. 3 is a schematic overview depicting a wireless communication network according to a deployment of embodiments herein.

Embodiments herein relate to wireless communication networks in general. FIG. 3 is a schematic overview depicting a communication network 1. The communication network 1 may comprise one or more RANs and one or more CNs. The communication network 1 may use one or a number of different technologies. Embodiments herein relate to recent technology trends that are of particular interest in a 5G context, however, embodiments are also applicable in further development of existing wireless communication systems such as e.g. LTE and Wideband Code Division Multiple Access (WCDMA).

In the communication network 1, wireless devices configured to communicate with the RAN e.g. a UE 10, such as a communication device. It should be understood by the skilled in the art that "UE" is a non-limiting term which means any terminal, wireless communication terminal, wireless device, narrowband-internet of things (NB-IoT) device, Machine Type Communication (MTC) device, Device to Device (D2D) terminal, or node e.g. smart phone, laptop, mobile phone, sensor, relay, mobile tablets or even a small base station capable of communicating using radio communication with a radio network node or a wireless device.

The communication network 1 comprises a number of network nodes such as a radio network node 12 also referred to as source access node providing radio coverage over a geographical area, a service area 11, of a first radio access technology (RAT), such as NR, LTE or similar. The radio network node 12 may be a transmission and reception point such as an access node, an access controller, a base station, e.g. a radio base station such as a gNodeB (gNB), an evolved Node B (eNB, eNode B), a NodeB, a base transceiver station, a radio remote unit, an Access Point Base Station, a base station router, a Wireless Local Area Network (WLAN) access point or an Access Point Station (AP STA), a transmission arrangement of a radio base station, a stand-alone access point or any other network unit or node capable of communicating with a wireless device within the area served by the radio network node 12 depending e.g. on the first radio access technology and terminology used. The radio network node 12 may be referred to as a serving radio network node such as a source access node wherein the service area may be referred to as a serving cell, and the serving network node communicates with the UEs in form of DL transmissions to the UEs and UL transmissions from the UEs. It should be noted that a service area may be denoted as cell, beam, beam group or similar to define an area of radio coverage. Signaling of data is performed between the network nodes and/or UEs such as uplink (UL) from the UE 10 to the radio network node 12, or downlink (DL) from the radio network node 12 to the UE 10.

The communication network 1 may further comprise one or more other network nodes such as core network nodes, Operations, administration and maintenance (OAM) nodes, data processing nodes or similar.

In telecommunication and coding theory, an error correcting code (ECC) may be used for controlling errors in data transferred over unreliable or noisy communication channels. Forward error correction (FEC) is a technique used wherein the central idea is that the sender encodes the message in a redundant way, by using an ECC. The redundancy allows the receiver to detect a limited number of errors that may occur anywhere in the message, and often to correct these errors without re-transmission. FEC gives the receiver the ability to correct errors without needing a reverse channel to request re-transmission of data, but at the cost of a fixed, higher forward channel bandwidth.

According to embodiments herein a network node 15 such as a receiving device e.g. the UE 10, the radio network node 12 or another network node comprises at least two processing cores connected with one another via a bus or a bus system. As an alternative, a Distributed Node (DN) and functionality, e.g. comprised in a cloud may be used for performing or partly performing the methods and actions described herein. The network node 15 decodes a received signal by performing iterations also referred to as message passing. Messages between the at least two processing cores are updated according to a set schedule e.g. only at specific times or iterations, e.g. a set interval, and not every iteration as in classic message passing procedures. The set schedule may be pre-set and the schedule may e.g. state that when an average absolute value of the messages reaches a certain value, then a full iteration should take place involving the at least two processing cores.

Figure 4:
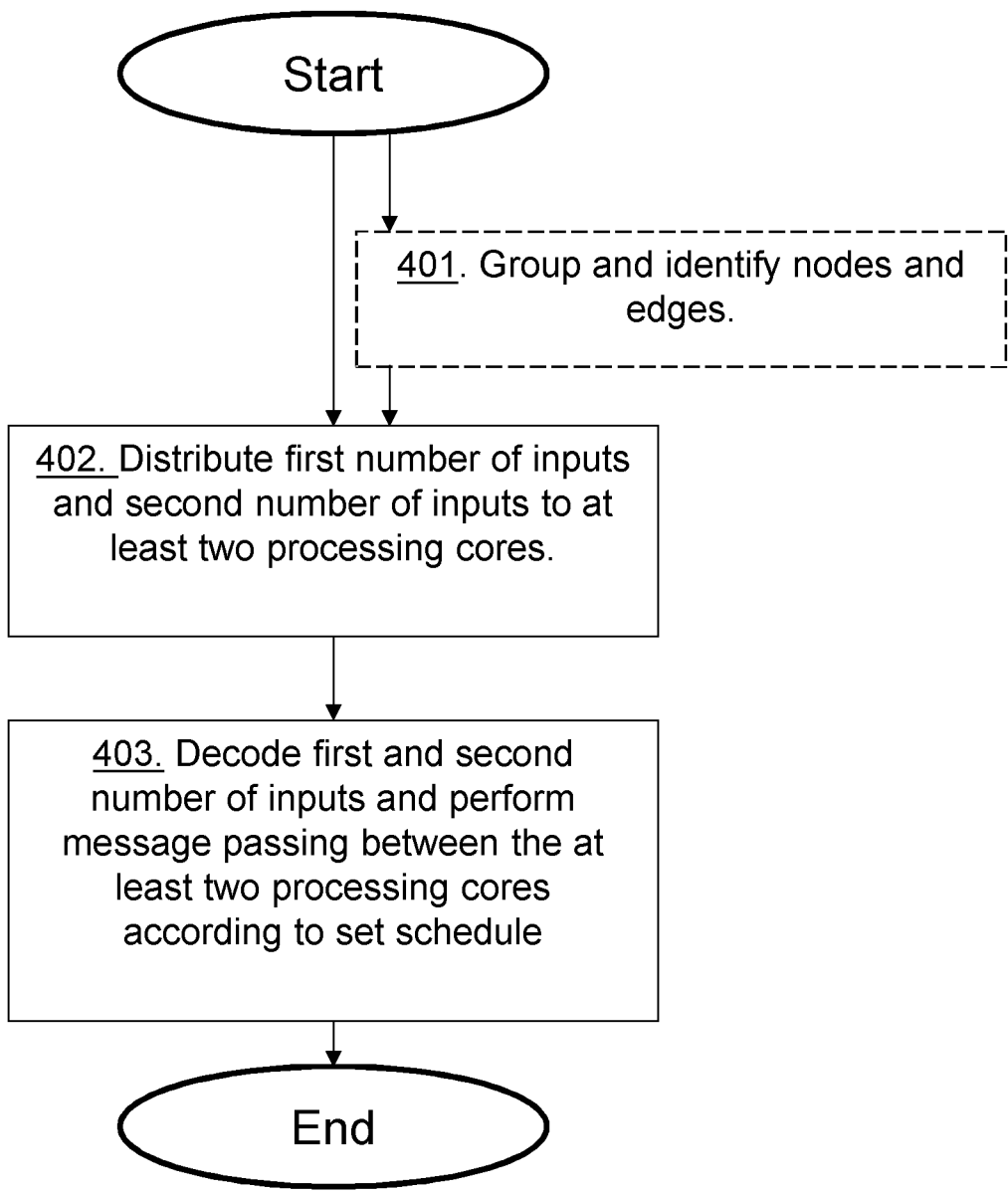
FIG. 4 shows a method performed by a network node according to embodiments herein.

The method actions performed by the network node 15 for handling a received signal in a communication network 1 according to embodiments will now be described with reference to a flowchart depicted in FIG. 4. The actions do not have to be taken in the order stated below, but may be taken in any suitable order. Actions performed in some embodiments are marked with dashed boxes.

Action 401. The network node 15 may group nodes in the code graph into communities, i.e., subset of nodes and/or edges, and may identify one or more edges that are within and across the communities, wherein the nodes represent functions and variables related to inputs of a demodulated signal, and edges represent relationships between nodes.

Action 402. The network node 15 distributes a first number of inputs of the demodulated signal to a first processing core of the at least two processing cores and a second number of inputs of the demodulated signal to a second processing core of the at least two processing cores. The first number of inputs may be related to the second number of inputs by being parts of one codeword.

Action 403. The network node 15 decodes the first number of inputs of the demodulated signal by a first message passing within the first processing core i.e. performs iterations, and decodes the second number of inputs of the demodulated signal by a second message passing within the second processing core. The network node 15 further decodes the demodulated signal by performing a third message passing between the different processing cores over a bus that is performed according to a set schedule. The first message passing may comprise performing a first number of iterations over the first processing core and/or the second message passing may comprise performing a second number of iterations over the second processing core, and the set schedule defines when to perform one or more iterations involving both the first and the second processing core, i.e. the third message passing. These message passings, also referred to as decoding algorithms, require passing of the messages back and forth between nodes, e.g. variable nodes and check nodes, over edges for a fixed number of times (known as "iterations") or till the result is achieved, hence the notion "iterative decoding" algorithms. The one or more iterations involving both the first and the second processing core may be limited and may be smaller in numbers than the first and/the second number of iterations. The set schedule may comprise a list indicating every occasion of the first message passing within the first processing core and/or of the second message passing within the second processing core, the third message passing between the different processing cores should be performed. The set schedule may be based on type of code, length of code and/or a performance of the bus. E.g. the more complex and/or the longer code the often the third message passing should be performed, and/or the slower communication over the bus the more seldom the third message passing should be performed. The set schedule may identify or define a subset of message handling cycles for performing a full message passing within the respective processing core while freezing a value of a message on edges between the at least two processing cores. Furthermore, the set schedule may define scheduling of the message exchange between processing cores and may give examples of decoding performance. The codes used in this description are not optimized for multicore decoding and should be considered as examples of embodiments. Optimization of the codes may further limit the performance loss (or improve the performance). More than two processing cores may be used and the exchange between the processing cores may take place in many ways, e.g., one-to-one, multiple disjoint one-to-one, one-to many, many to one, depending on the limitations of the actual hardware.

The H-matrix and the decoding graph are two different representations of a code. The decoding graph is a visual representation of the H-matrix. In the H matrix, each row corresponds to a parity check equation and each column corresponds to a variable (bit in the codeword). The 1's in a row tells which variables are part of that parity check equation. The 1's in a column tells which parity check equations depend on that variable. In the graph representation, the variables and check nodes correspond to the codeword bits and the check equations, and the edges correspond to the 1's—there is an edge between a variable node and a check node if and only if that variable is a part of that check equation.

Figure 5:
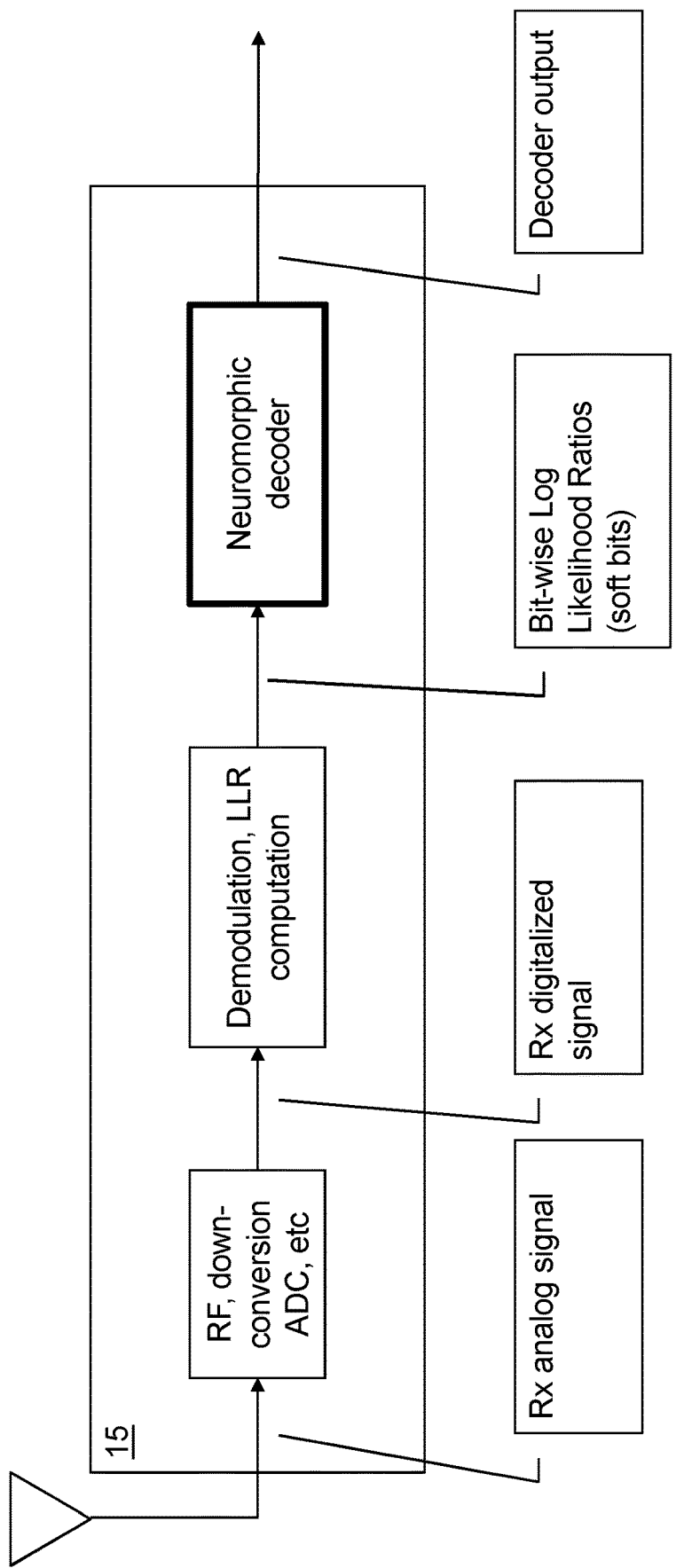
FIG. 5 shows a receiver comprising a decoding unit according to embodiments herein.

FIG. 5 is a block diagram depicting an example of a receiver handling a received signal. The receiver comprises a first module performing a radio frequency down conversion an analogue to digital conversion etc forming from an analog signal to a Rx digitalized signal. The receiver further comprises a second module performing e.g. demodulation and Log-likelihood ratio computation of the received signal e.g. into a bit-wise LLRs (soft bits). The receiver further comprises a third module comprising a decoder e.g. a neuromorphic decoder configured to perform the decoding over the at least two processing cores according to embodiments herein into a decoder output.

Figure 6:
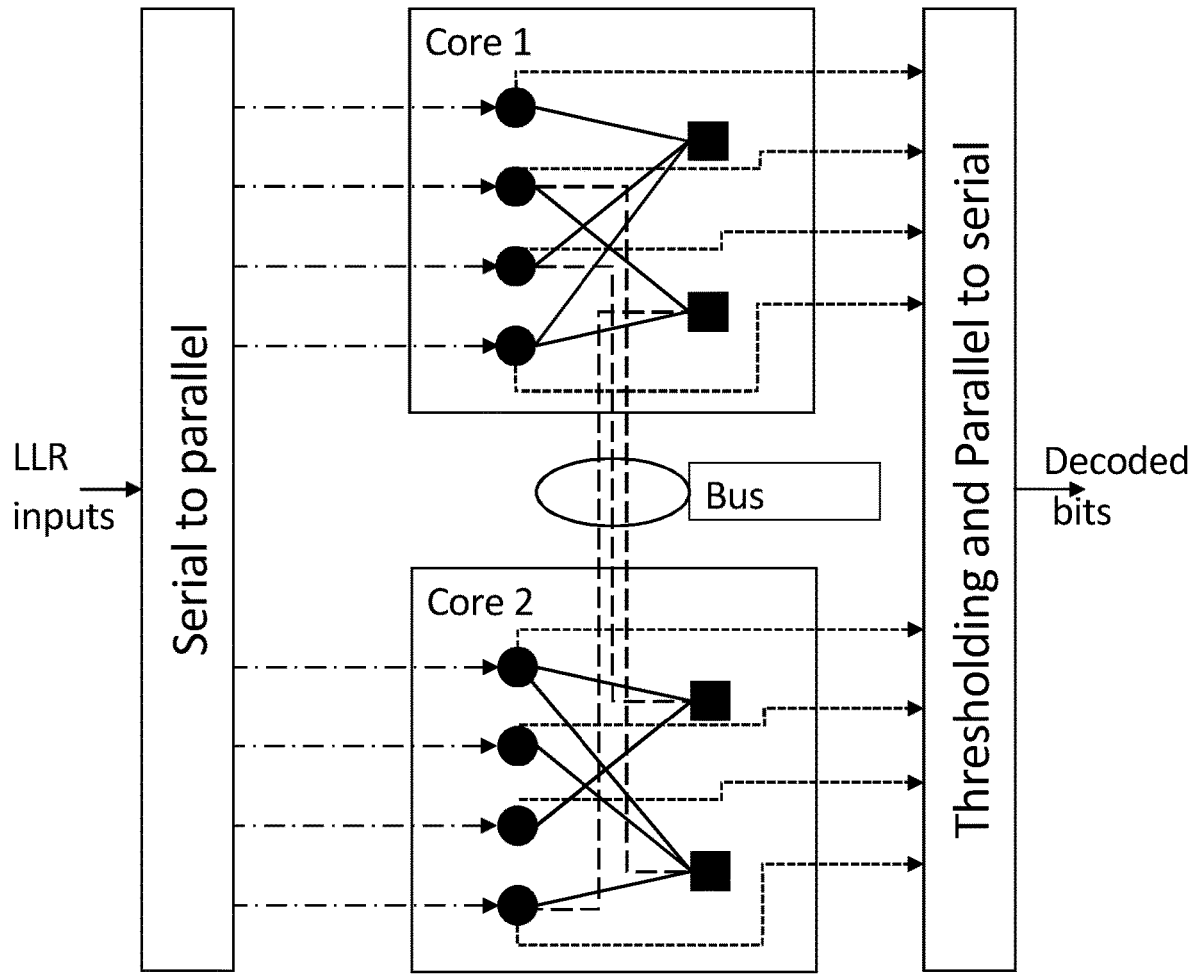
FIG. 6 shows a visual representation according to some embodiments herein.

FIG. 6 is a block diagram disclosing a visual representation of a decoding process over the at least two processing cores wherein input bits e.g. LLR bits are distributed to the at least two processing cores and the graph representation illustrates the variables as circles and check nodes are squares and edges are the connections between the variables and the check nodes.

According to embodiments herein, for a fixed performance target in terms of frame or bit error rate, it is possible to perform less exchanges of messages between the processing cores provided that a sufficient number of computations are made within the cores. An example is shown in FIG. 6 wherein edges with full exchange or message passing during each iteration is illustrated with full lines and edges used according to the set schedule is dashed. Different types of line refer to different use of the edges, and in particular

- dot-dash line: used only once, directly from channel (input)
- short dash line: used only once, to output
- long dash line: used multiple times, once per global iteration (also called full iteration)
- solid line: used multiple times, once per local iteration and global iteration (basically, at every iteration irrespective of the type of iteration).

An advantage is therefore that, if the bus is slow and each core is fast enough, decoding with the novel algorithm is faster than a classic message passing decoding implemented on GPUs or TPUs and achieves the same performance.

In general, the performance loss incurred by reducing the number of full iterations can be partially or totally regained by executing additional iterations within the processing cores. Under the assumption above, this can be done without incurring additional decoding delay. Embodiments herein discuss a specific case of using two processing cores and one bus connecting the two processing cores. It should however be noted that extensions are possible. Embodiments herein are not limited to any specific network node, and can be implemented in any node or cloud system where core-based computation equipment is used. It is even conceivable that the bus system stretches between different nodes or server blades, though the bus delay will likely be longer in those cases. The codes used in this description are not optimized for multicore decoding.

Optimization of the codes may further limit the performance loss (or improve the performance). Thus, at least two processing cores, also referred to as computational cores, are connected to each other through a bus. Information can flow through the bus at much lower speed than within the processing cores, and thus the more computation can be carried inside each core and the less exchanges on the bus, the better. An algorithm for decoding general LDPC codes on several cores connected through a bus is herein proposed. An example of a pseudocode of the algorithm is as follows.

Inputs:
H: parity-check matrix
C: community matrix (1 if same community (computation core); 0 if different communities (computation core))
iter_list: list of iterations with full message passing which is an example of the set schedule, i.e., iterations during which all edges in the graph are updated, including the ones between different processing cores. E.g. then list may indicate that the full message passing should be performed every fifth iteration of the first/second message passing
num_mp_iter total number of message passing iterations
Output:
c_est estimated codeword

| Pseudocode |
| --- |
| MessagePassingDecoding(H, C, *iter list* , num_mp_iter):<br>  % initialization<br>  m, n = H.shape<br>  for all v, for all c: R_{cv} = 0<br>  for all v: Q_{v} = 0<br>  % message passing<br>  for i in {1, 2, ..., num_mp_iter}:<br>    to_freeze = (i not in iter_list)<br>    for all c in {1, 2, ..., m}:<br>      for all v in neighborhood(c):<br>        in_same_community = (C_{cv}==1)<br>        *if (not to_freeze) or in_same_community:*<br>          update_mp(R, Q) | c_est=zeros(1, n)
c_est[Q<0]=1

The function update_mp updates R and Q according to some message passing updating rule (sum-product, min-sum, etc.). Embodiments herein introduce the use of of the communities and the set schedule which is the underlined part in the above pseudocode.

Figure 7:
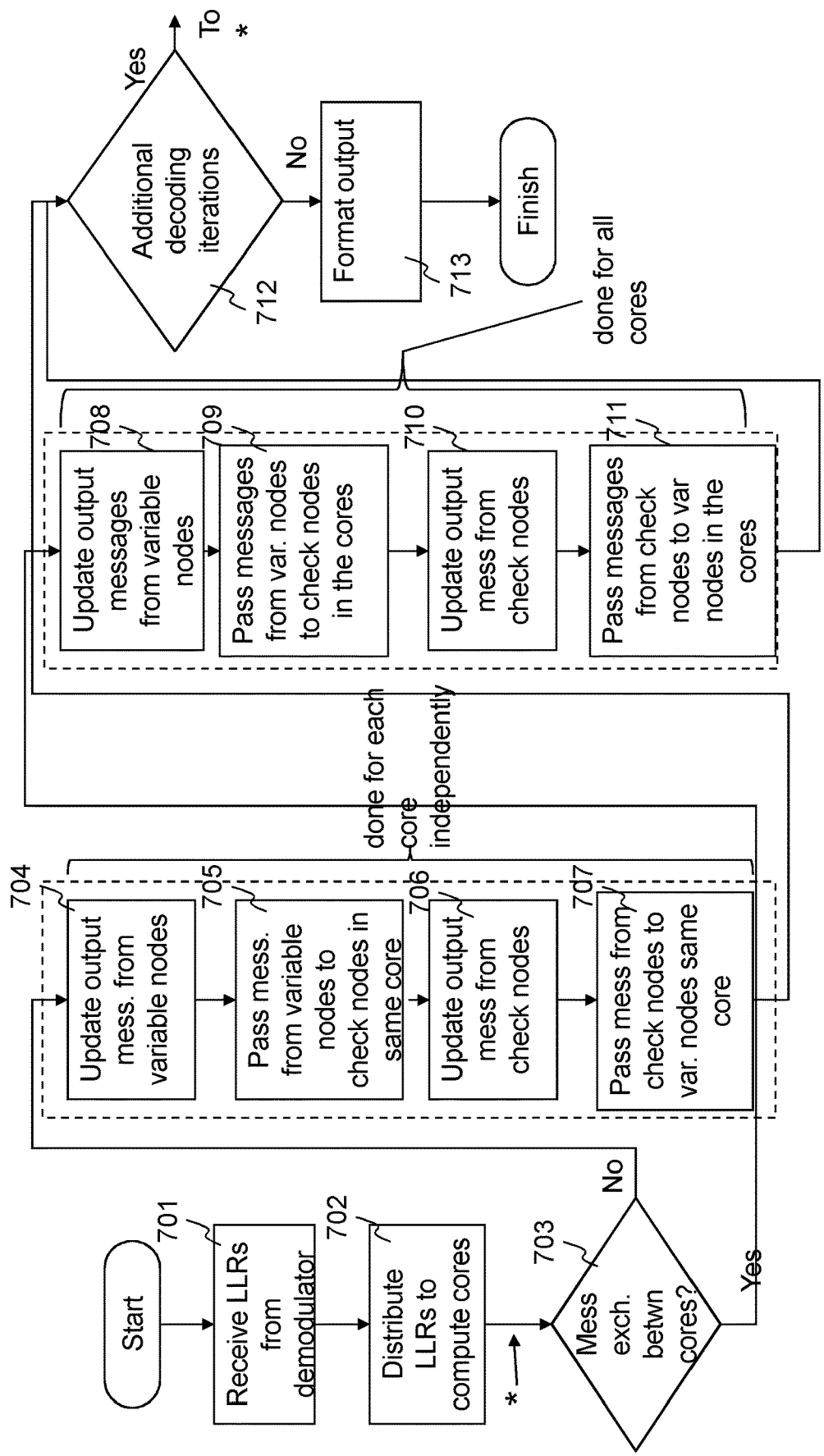
FIG. 7 shows a flowchart depicting a method according to some embodiments herein.

FIG. 7 discloses a detailed flowchart of some embodiments herein. The left column is the initialization, the initial move of received data to the different computing cores, this takes place over the dot-dashed lines in FIG. 6. The second-to-left column is what takes place during the local iterations, when data is only passed within the processing cores, this takes place over the solid lines in FIG. 6. The second-to-right column is the global iterations when data is exchanged between at least two processing cores, this place over the long dashed lines in FIG. 6. The rightmost column is the check to see if the stopping criterion is met, e.g. max number of iterations reached, all checks are met, magnitude of messages, etc., and the output from the decoder. this is the short dashed lines in FIG. 6.

Action 701. The network node 15 receives from a demodulator LLRs.

Action 702. The network node 15 distributes LLRs to processing cores also referred to as compute cores.

Action 703. The network node 15 determines whether to exchange message between the processing cores or not. This is according to the set schedule. This is: is the condition for the set schedule fulfilled or not.

Action 704. That not being the case, the network node 15 for each core independently, updates output messages from variable nodes.

Action 705. The network node 15 passes messages from the variable nodes to check nodes in same core.

Action 706. The network node 15 updates output messages from check nodes.

Action 707. The network node 15 passes messages from check nodes to the variables node in the same core.

Action 708. In case the set schedule defines message exchange between the cores, the network node 15 updates messages from variable nodes.

Action 709. The network node 15 passes messages from variable nodes to check nodes in the different cores.

Action 710. The network node 15 updates the output messages from the check nodes.

Action 711. The network node 15 passes messages from the check nodes to the variable nodes in the different cores.

Action 712. The network node 15 further determines whether to perform additional iterations. That being the case, the method goes back to action 703.

Action 713. That not being the case, the network node 15 formats the output of the decoding.

Embodiments herein disclose a message passing algorithm to decode general codes e.g. LDPC codes on distributed processing cores connected with buses, comprising:

Grouping variable and check nodes into communities, and therefore identifying the edges of the graph that are within communities and across communities Identifying the subset of iterations during which the algorithm performs full message passing within the communities while freezing the value of the messages on the edges across communities Showing how to modify current message passing algorithms to accommodate for the partial updates (condition underlined in the pseudocode in § 5)

According to embodiments herein, for a fixed performance target in terms of frame or bit error rate, it is possible to perform less exchanges of messages between the cores provided that a sufficient number of computations are made within the cores.

Figure 8:
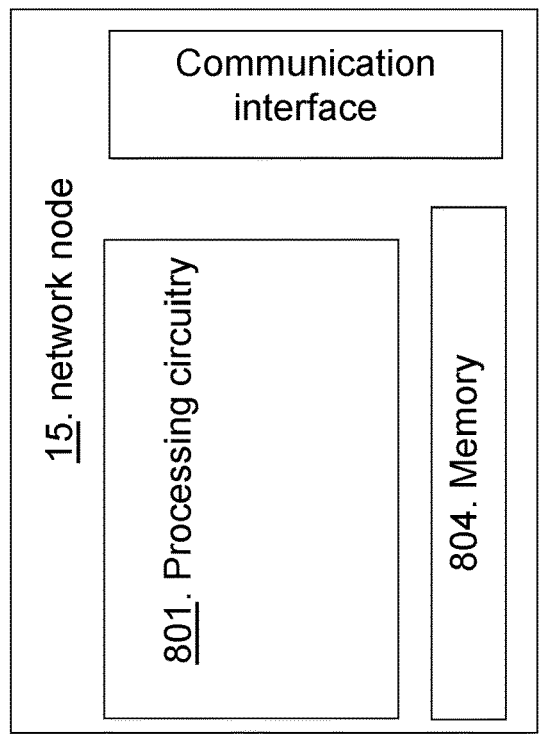
FIG. 8 shows a block diagram depicting a network node according to embodiments herein.
Figure 8:
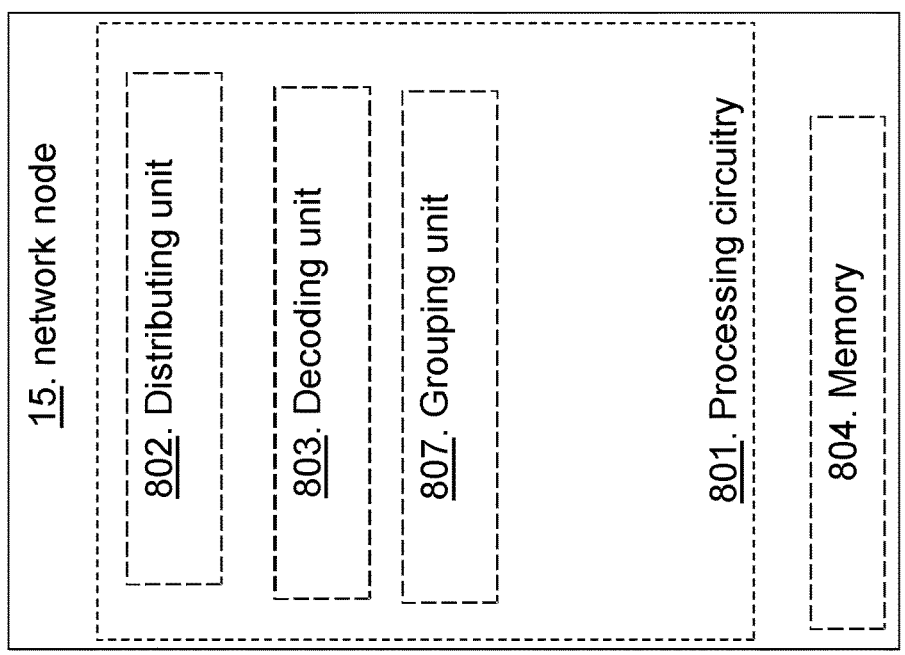
Figure 8:
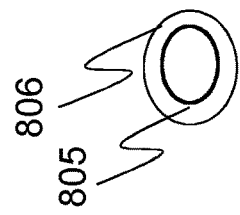

FIG. 8 is a block diagram depicting the network node 15, in two embodiments, for handling the received signal in the communication network according to embodiments herein.

The network node 15 may comprise processing circuitry 801, e.g. one or more processors, configured to perform the methods herein.

The network node 15 may comprise a distributing unit 802. The network node 15, the processing circuitry 801, and/or the distributing unit 802 is configured to distribute the first number of inputs of the demodulated signal to the first processing core of the at least two processing cores and the second number of inputs of the demodulated signal to the second processing core of the at least two processing cores. The first number of inputs may be related to the second number of inputs by being parts of one codeword.

The network node 15 may comprise a decoding unit 803. The network node 15, the processing circuitry 801, and/or the decoding unit 803 is configured to decode the first number of inputs of the demodulated signal by the first message passing within the first processing core, and to decode the second number of inputs of the demodulated signal by the second message passing within the second processing core. The network node 15, the processing circuitry 801, and/or the decoding unit 803 is further configured to decode the demodulated signal by performing the third message passing between the different processing cores over the bus that is performed according to the set schedule. The first message passing may comprise performing the first number of iterations over the first processing core and/or the second message passing may comprise performing the second number of iterations over the second processing core. Furthermore, the set schedule may define when to perform one or more iterations involving both the first and the second processing core. The one or more iterations involving both the first and the second processing core may be limited and may be smaller in numbers than the first and/the second number of iterations. The set schedule may comprise the list, e.g. iterlist, indicating every occasion of the first message passing within the first processing core and/or of the second message passing within the second processing core, the third message passing between the different processing cores should be performed. The set schedule may be based on type of code, length of code and/or a performance of the bus.

The network node 15 may comprise a grouping unit 807. The network node 15, the processing circuitry 801, and/or the grouping unit 807 may be configured to group nodes in the code graph into communities and to identify one or more edges that are within the communities and across the communities. The nodes represent functions and variables related to the inputs of the demodulated signal, and edges represent relationships between nodes. The set schedule may define the subset of message handling cycles for performing a full message passing within the respective processing core while freezing a value of a message on edges between the at least two processing cores.

The network node 15 further comprises a memory 804. The memory comprises one or more units to be used to store data on, such as iterations, set schedule, values, variables, functions, applications to perform the methods disclosed herein when being executed, and similar. The network node may comprise a communication interface comprising e.g. a transmitter, a receiver, a transceiver, and/or one or more antennas.

The methods according to the embodiments described herein for the network node may respectively be implemented by means of e.g. a computer program product 805 or a computer program, comprising instructions, i.e., software code portions, which, when executed on at least one processor, cause the at least one processor to carry out the actions described herein, as performed by the network node 15. The computer program product 805 may be stored on a computer-readable storage medium 806, e.g. a disc, a universal serial bus (USB) stick or similar. The computer-readable storage medium 806, having stored thereon the computer program, may comprise the instructions which, when executed on at least one processor, cause the at least one processor to carry out the actions described herein, as performed by the node. In some embodiments, the computer-readable storage medium may be a transitory or a non-transitory computer-readable storage medium.

In some embodiments a more general term "network node" or "radio network node" is used and it can correspond to any type of radio-network node or any network node, which communicates with a computing device and/or with another network node. Examples of network nodes are servers, a NodeB (NB), an eNodeB, a gNB, a network node belonging to Master cell group (MCG) or Secondary cell group (SCG), base station (BS), multi-standard radio (MSR) radio node such as MSR BS, e, network controller, radio-network controller (RNC), base station controller (BSC), relay, donor node controlling relay, base transceiver station (BTS), access point (AP), transmission points, transmission nodes, Remote radio Unit (RRU), Remote Radio Head (RRH), nodes in distributed antenna system (DAS), etc.

In some embodiments the non-limiting term wireless device or user equipment (UE) is used and it refers to any type of wireless device communicating with a network node and/or with another wireless device in a cellular or mobile communication system. Examples of UE are target device, device to device (D2D) UE, proximity capable UE (aka ProSe UE), machine type UE or UE capable of machine to machine (M2M) communication, Tablet, mobile terminals, smart phone, laptop embedded equipped (LEE), laptop mounted equipment (LME), USB dongles etc.

Embodiments are applicable to any RAT or multi-RAT systems, where the wireless device receives and/or transmit signals (e.g. data) e.g. New Radio (NR), Wi-Fi, Long Term Evolution (LTE), LTE-Advanced, Wideband Code Division Multiple Access (WCDMA), Global System for Mobile communications/enhanced Data rate for GSM Evolution (GSM/EDGE), Worldwide Interoperability for Microwave Access (WiMax), or Ultra Mobile Broadband (UMB), just to mention a few possible implementations.

As will be readily understood by those familiar with communications design, that functions means or units may be implemented using digital logic and/or one or more microcontrollers, microprocessors, or other digital hardware. In some embodiments, several or all of the various functions may be implemented together, such as in a single application-specific integrated circuit (ASIC), or in two or more separate devices with appropriate hardware and/or software interfaces between them. Several of the functions may be implemented on a processor shared with other functional components of a wireless device or network node, for example.

Alternatively, several of the functional elements of the processing means discussed may be provided through the use of dedicated hardware, while others are provided with hardware for executing software, in association with the appropriate software or firmware. Thus, the term "processor" or "controller" as used herein does not exclusively refer to hardware capable of executing software and may implicitly include, without limitation, digital signal processor (DSP) hardware and/or program or application data. Other hardware, conventional and/or custom, may also be included. Designers of communications devices will appreciate the cost, performance, and maintenance trade-offs inherent in these design choices.

Any appropriate steps, methods, features, functions, or benefits disclosed herein may be performed through one or more functional units or modules of one or more virtual apparatuses. Each virtual apparatus may comprise a number of these functional units. These functional units may be implemented via processing circuitry, which may include one or more microprocessor or microcontrollers, as well as other digital hardware, which may include digital signal processors (DSPs), special-purpose digital logic, and the like. The processing circuitry may be configured to execute program code stored in memory, which may include one or several types of memory such as read-only memory (ROM), random-access memory (RAM), cache memory, flash memory devices, optical storage devices, etc. Program code stored in memory includes program instructions for executing one or more telecommunications and/or data communications protocols as well as instructions for carrying out one or more of the techniques described herein. In some implementations, the processing circuitry may be used to cause the respective functional unit to perform corresponding functions according one or more embodiments of the present disclosure.

It will be appreciated that the foregoing description and the accompanying drawings represent non-limiting examples of the methods and apparatus taught herein. As such, the apparatus and techniques taught herein are not limited by the foregoing description and accompanying drawings. Instead, the embodiments herein are limited only by the following claims and their legal equivalents.

| Abbreviation | Explanation |
|---|---|
| 5GS | 5G System |
| 5GC | 5G Core network |
| 5QI | 5G QoS Indicator |
| AMF | Access and Mobility Management Function |
| CHO | Conditional Handover |
| C-RNTI | Cell RNTI |
| DL | Downlink |
| eNB | Evolved Node B |
| eMBB | Enhanced Make-before-break |
| E-UTRAN | Evolved Universal Terrestrial Access Network |
| EPC | Evolved Packet Core network |
| gNB | 5G Node B |
| HO | Handover |
| IE | Information Element |
| IIoT | Industrial Internet of Things |
| LTE | Long-term Evolution |
| MBB | Make-before-break |
| NCC | Next Hop Chaining Counter |
| NG-RAN | Next Generation Radio Access Network |
| NR | New Radio |
| PDCP | Packet Data Convergence Protocol |
| RA | Random Access |
| RAR | Random Access Response |
| RAT | Radio Access Technology |
| RNTI | Radio Network Temporary Identifier |
| RRC | Radio Resource Control |
| Rx | Receive |
| SDU | Service Data Unit |
| SN | Secondary Node |
| SN | Sequence Number |
| sync | synchronization |
| Tx | Transmit |
| UE | User Equipment |
| UL | Uplink |
| UPF | User Plane Function |
| URLLC | Ultra-Reliable Low-Latency Communication |

REFERENCES

[1] Nvidia, "NVIDIA Tesla P100," whitepaper

[2] Davies, M.; et al., "Loihi: A Neuromorphic Manycore Processor with On-Chip Learning," IEEE Micro, vol. 38, no. 1, pp-82-99, January/February 2018.

[3] Merolla, P. A.; et al., "A million spiking-neuron integrated circuit with a scalable communication network and interface," Science. 345 (6197): 668, 2014.

[4] Yan, Yexin; Kappel, David; Neumarker, Felix; Partzsch, Johannes; Vogginger, Bernhard; Hoppner, Sebastian; Furber, Steve; Maass, Wolfgang; Legenstein, Robert; Mayr, Christian (2019). "Efficient Reward-Based Structural Plasticity on a SpiNNaker 2 Prototype". IEEE Transactions on Biomedical Circuits and Systems. 13 (3): 579-591.

[5] Jouppi, N. P.; et al. "In-Datacenter Performance Analysis of a Tensor Processing Unit," 44th International Symposium on Computer Architecture (ISCA), Toronto, Canada, Jun. 26, 2017.

[6] Qiumin Xu, Hyeran Jeon, Murali Annavaram and Ming Hsieh, "Graph Processing on GPUs: Where are the Bottlenecks?"

The invention claimed is:

1. A method performed by a network node for handling a received signal in a communication network, the method comprising:
distributing a first number of inputs of a demodulated signal to a first processing core of at least two processing cores and a second number of inputs of the demodulated signal to a second processing core of the at least two processing cores; and
decoding the first number of inputs of the demodulated signal by a first message passing within the first processing core, and decoding the second number of inputs of the demodulated signal by a second message passing within the second processing core, and further decoding the demodulated signal by performing a third message passing between the different processing cores over a bus that is performed according to a set schedule, the set schedule being based on one or more of a type of code, a length of code and a performance of the bus.

2. The method according to claim 1, wherein the first number of inputs are related to the second number of inputs by being parts of one codeword.

3. The method according to claim 1, wherein one or more of the first message passing comprises performing a first number of iterations over the first processing core and the second message passing comprises performing a second number of iterations over the second processing core, and the set schedule defines when to perform one or more iterations involving both the first and the second processing core.

4. The method according to claim 3, wherein the one or more iterations involving both the first and the second processing core are limited and are smaller in numbers than at least one of the first number of iterations and the second number of iterations.

5. The method according to claim 1, wherein the set schedule comprises a list indicating every occasion of one or more of the first message passing within the first processing core, of the second message passing within the second processing core and of the third message passing between the different processing cores should be performed.

6. The method according to claim 1, further comprising grouping nodes in a code graph into communities and identifying one or more edges that are within the communities and across the communities, wherein the nodes represent functions and variables related to the inputs of the demodulated signal, and edges represent relationships between nodes.

7. The method according to claim 6, wherein the set schedule identifies a subset of message handling cycles for performing a full message passing within the respective processing core while freezing a value of a message on edges between the at least two processing cores.

8. A network node for handling a received signal in a communication network, the network node configured to:
distribute a first number of inputs of a demodulated signal to a first processing core of at least two processing cores and a second number of inputs of the demodulated signal to a second processing core of the at least two processing cores; and
decode the first number of inputs of the demodulated signal by a first message passing within the first processing core, and decode the second number of inputs of the demodulated signal by a second message passing within the second processing core, and to further decode the demodulated signal by performing a third message passing between the different processing cores over a bus that is performed according to a set schedule, the set schedule being based on one or more of a type of code, a length of code and a performance of the bus.

9. The network node according to claim 8, wherein the first number of inputs are related to the second number of inputs by being parts of one codeword.

10. The network node according to claim 8, one or more of the first message passing comprises performing a first number of iterations over the first processing core and the second message passing comprises performing a second number of iterations over the second processing core, and the set schedule defines when to perform one or more iterations involving both the first and the second processing core.

11. The network node according to claim 10, wherein the one or more iterations involving both the first and the second processing core are limited and are smaller in numbers than at least one of the first number of iterations and the second number of iterations.

12. The network node according to claim 8, wherein the set schedule comprises a list indicating every occasion of one or more of the first message passing within the first processing core, of the second message passing within the second processing core and of the third message passing between the different processing cores should be performed.

13. The network node according to claim 8, wherein the network node is configured to group nodes in a code graph into communities and to identify one or more edges that are within the communities and across the communities, wherein the nodes represent functions and variables related to the inputs of the demodulated signal, and edges represent relationships between nodes.

14. The network node according to claim 13, wherein the set schedule defines a subset of message handling cycles for performing a full message passing within the respective processing core while freezing a value of a message on edges between the at least two processing cores.

15. A non-transitory computer-readable storage medium, having stored there on a computer program comprising instructions which, when executed on at least one processor, cause the at least one processor to carry out a method performed by a network node for handling a received signal in a communication network, the method comprising:
distributing a first number of inputs of a demodulated signal to a first processing core of at least two processing cores and a second number of inputs of the demodulated signal to a second processing core of the at least two processing cores; and
decoding the first number of inputs of the demodulated signal by a first message passing within the first processing core, and decoding the second number of inputs of the demodulated signal by a second message passing within the second processing core, and further decoding the demodulated signal by performing a third message passing between the different processing cores over a bus that is performed according to a set schedule, the set schedule being based on one or more of a type of code, a length of code and a performance of the bus.

16. The method according to claim 2, wherein the first message passing comprises performing a first number of iterations over the first processing core and/or the second message passing comprises performing a second number of iterations over the second processing core, and the set schedule defines when to perform one or more iterations involving both the first and the second processing core.

17. The method according to claim 16, wherein the one or more iterations involving both the first and the second processing core are limited and are smaller in numbers than the first number of iterations, the second number of iterations or both.

18. The method according to claim 2, wherein the set schedule comprises a list indicating every occasion of the first message passing within the first processing core and/or of the second message passing within the second processing core the third message passing between the different processing cores should be performed.

* * * * *